US010388845B2

(12) United States Patent
Mascolo et al.

(10) Patent No.: US 10,388,845 B2
(45) Date of Patent: Aug. 20, 2019

(54) THERMOELECTRIC GENERATOR (71) Applicant: CONSORZIO DELTA TI RESEARCH, Milan (MI) (IT)

(72) Inventors: Danilo Mascolo, Bologna (IT); Antonietta Buosciolo, Ariano Irpino (IT); Giuseppe Latessa, Rome (IT); Giuseppe Gammariello, Trani (IT); Marco Giusti, Rome (IT); Italo Gison, Monterotondo (IT)

(73) Assignee: CONSORZIO DELTA TI RESEARCH, Milan (MI) (IT)

( * ) Notice: Subject to any disclaimer, the term of this patent is extended or adjusted under 35 U.S.C. 154(b) by 0 days.

(21) Appl. No.: 15/769,092

(22) PCT Filed: Oct. 20, 2016

(86) PCT No.: PCT/IB2016/056318
§ 371 (c)(1),
(2) Date: Apr. 18, 2018

(87) PCT Pub. No.: WO2017/068527
PCT Pub. Date: Apr. 27, 2017

(65) Prior Publication Data
US 2018/0294398 A1 Oct. 11, 2018

(30) Foreign Application Priority Data
Oct. 23, 2015 (IT) .................. 102015000064890

(51) Int. Cl.
H01L 35/32 (2006.01)
H01L 27/16 (2006.01)
(Continued)

(52) U.S. Cl.
CPC .............. *H01L 35/32* (2013.01); *H01L 27/16* (2013.01); *H01L 35/22* (2013.01); *H01L 35/30* (2013.01);
(Continued)

(58) Field of Classification Search
None
See application file for complete search history.

(56) References Cited

U.S. PATENT DOCUMENTS

| 7,875,791 B2 | 1/2011 | Leonov et al. |
| 2006/0102223 A1 | 5/2006 | Chen et al. |
| 2014/0246066 A1 | 9/2014 | Chen et al. |

FOREIGN PATENT DOCUMENTS

| JP | H03155376 A | 7/1991 |
| JP | H10303469 A | 11/1998 |

OTHER PUBLICATIONS

International Search Report and Written Opinion for International Application No. PCT/IB2016/056318 (13 Pages) (dated Apr. 7, 2017).

*Primary Examiner* — Tamir Ayad
(74) *Attorney, Agent, or Firm* — Lucas & Mercanti, LLP (57) ABSTRACT A thermoelectric generator of compact size, having a simple structure configured for increasing the conversion efficiency of thermal energy into electric energy, so as it is possible to transform into electric current also as amount of heat per unit surface greater than thin film prior art devices, has a base silicon wafer and a cover silicon wafer, wherein the cover silicon wafer is facing said base silicon wafer in such a way that the respective top contacts are in contact and the space between the cover silicon wafer and the base silicon wafer is a space in which vacuum is made or a gas is present, in particular air.

12 Claims, 7 Drawing Sheets (51) Int. Cl.
*H01L 35/22* (2006.01)
*H01L 35/30* (2006.01)
*H01R 13/73* (2006.01)
*H01L 35/34* (2006.01)

(52) U.S. Cl.
CPC ............. *H01L 35/34* (2013.01); *H01R 13/73* (2013.01); *H01L 2224/16225* (2013.01)

Prior art

Fig. 1

Prior art

- Silicon
- Nitride
- Metal
- Poly N
- Oxide
- Poly P

| | |
|---|---|
| ▨ | Silicon wafer |
| ▩ | Electric insulator (for example silicon nitride) |
| ▨ | Metal |
| ▨ | TE material (P-type or N-type) |
| ☐ | Silicon oxide |

Fig. 14

THERMOELECTRIC GENERATOR

CROSS-REFERENCE TO RELATED APPLICATIONS

This application is a 371 of PCT/IB2016/056318, filed Oct. 20, 2016 which claims the benefit of Italian Patent Application No. 102015000064890, filed Oct. 23, 2015.

FIELD OF THE INVENTION

The present invention relates to a thermoelectric generator. More in particular, the invention relates to the structure of a thermoelectric generator, based on a thermoelectric material in the form of a thin film and realized with a microelectronic technology, that may be fabricated through planar processes and correlated techniques of 3D heterogeneous or hybrid integration.

BACKGROUND OF THE INVENTION

A thermoelectric generator is a device that allows to transform thermal energy into electric energy, thanks to the possibility of exploiting the effect known as Seebeck effect.

The functioning of most of prior art thermoelectric generators is based on the use of a thermoelectric material with a high merit factor ZT, such as bismute telluride and alloys thereof.

Nevertheless, bismute telluride and alloys thereof are scarcely available in nature and as a consequence thermoelectric generators are expensive and hardly suitable for mass production.

Moreover, these materials cannot be easily scaled down because they are incompatible with manufacturing processes used in microelectronic manufacturing industries.

As a consequence, it is not possible to realize thermoelectric generators on a large scale or to satisfy big markets (automotive, consumer electronics) thus hardly in line with development trends such as Internet of Things or Wearable electronics.

In the last decades, thus, attention has been paid to the possibility of realizing miniaturized thermoelectric generators, using process technologies that are typical for MEMS devices, CMOS devices and more in general for ICs.

Thermoelectric generators are composed of a set of thermocouples.

A thermocouple is composed of two electrical conducting materials or, as an alternative, to a p-doped semiconductor and a n-doped semiconductor joined together by means of a connection with a high electrical conductivity, typically realized through a metal.

Thermocouples are generally connected electrically in series and thermally in parallel for obtaining a voltage sufficient for powering an electronic device.

A configuration of a thermocouple may be either in-plane or out-of-plane, depending on whether the heat flux flowing throughout a thermocouple is in parallel to or orthogonal with the plane in which electric current flows.

Figure 1:
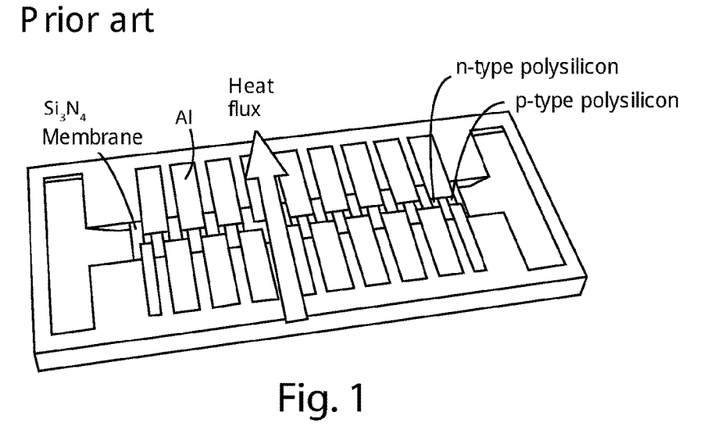
FIG. 1 shows the layout of an in-plane configuration device, according to the prior art.

From a point of view, the fabrication processes of thermoelectric generators, the thermocouples of which are in an in-plane configuration (see FIG. 1 that depicts the configuration of the publication of Y. Van Andel et al.), are simpler than fabrication processes of thermoelectric generators the thermocouples of which are in an out-of-plane configuration.

From another point of view, a drawback of a thermoelectric generator the thermocouples of which are in an in-plane configuration in respect to a thermoelectric generator the thermocouples of which are in an out-of-plane configuration, is that area occupation is larger and as a consequence there is a miniaturization loss. In the industry of microelectronics, generally, larger areas imply a greater production cost of the thermoelectric generator.

Examples of miniaturized thermoelectric generators in an in-plane configuration are disclosed in the following publications:

Y. Van Andel, M. Jambunathan, R. J. M. Vullers, V. Leonov, Membrane-less in-plane bulk-micromachined thermopiles for energy harvesting, Microelectronic Engineering, Vol. 87 (2010) 1294-1296;

Xie, J.; Lee, C.; Feng, H. Design, fabrication and characterization of CMOS MEMS-based thermoelectric power generators. J. Micromech. Syst. 2010, 19, 317-324;

Kao, P.-H.; Shih, P.-J.; Dai, C.-L.; Liu, M.-C. Fabrication and characterization of CMOS-MEMS thermoelectric micro generators. Sensors 2010, 10, 1315-1325;

Wang, Z.; Van Andel, Y.; Jambunathan, M.; Leonov, V.; Elfrink, R.; Vullers, J. M. Characterization of a bulk-micromachined membraneless in-plane thermopile. J. Electron. Mater. 2011, 40, 499-503.13;

patent U.S. Pat. No. 7,875,791 "Method for manufacturing a thermopile on a membrane and a membrane-less thermopile, the thermopile thus obtained and a thermoelectric generator comprising such thermopiles" Vladimir Leonov, Paolo Fiorini, Chris Van Hoof (2011).

Examples of miniaturized thermoelectric generators in an out-of-plane configuration are disclosed in the following publications:

Bottner H., Nurnus, J.; Schubert, A.; Volkert, F. "New high density micro structured thermogenerators for stand alone sensor systems" in Proceedings of 26th International Conference on Thermoelectrics, 2007. ICT 2007 (3-7 Jun. 2007) Pages 306-309.

M. Strasser, R. Aigner, M. Franosch, G. Wachutka, "Miniaturized thermoelectric generators based on poly-Si and poly-SiGe surface micromachining", Sensors and Actuators A, Vol. 97-98, 535-542 (2002).

Su, J.; Leonov, V.; Goedbloed, M.; van Andel, Y.; de Nooijer, M.C.; Elfrink, R.; Wang, Z.; Vullers, R. J. A batch process micromachined thermoelectric energy harvester: Fabrication and characterization. J. Micromech. Microeng. 2010, doi: 10.1088/0960-1317/20/10/104005.

Figure 2:
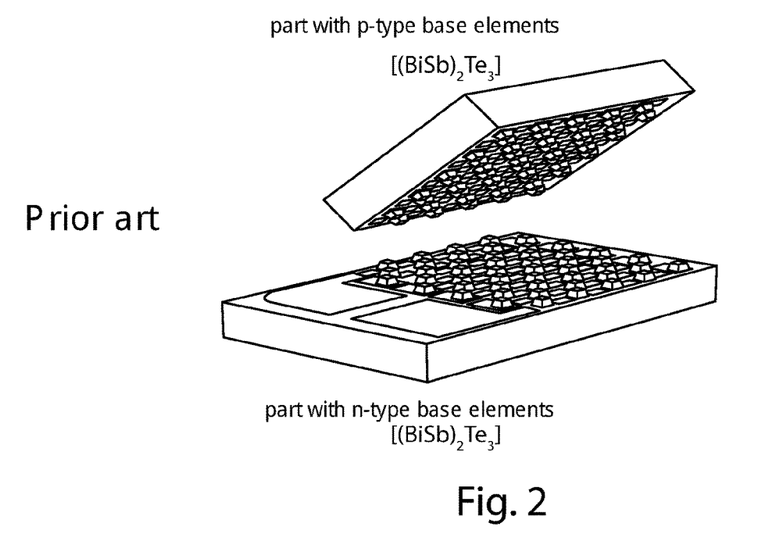
FIG. 2 shows a schematic view of a TEG in an out-of-plane configuration, realized with a thin film technology, according to the prior art.

Referring to the miniaturized thermoelectric generator mentioned in the publication by Bottner et al. and shown in FIG. 2, this miniaturized thermoelectric generator is obtained by means of a flip chip bonding technique. Nevertheless, the used materials are of known type, i.e. bismute telluride and alloys thereof, and are deposited onto silicon wafer by sputtering.

Figure 3:
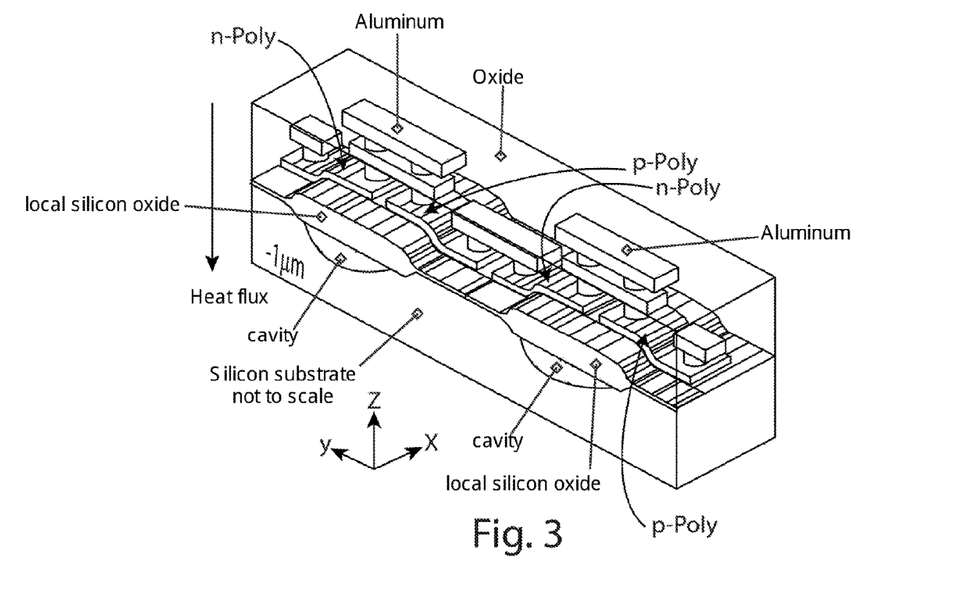
FIG. 3 shows a schematic view of two thermoelectric couples in an out-of-plane configuration realized by BiCMOS, according to the prior art.

Referring to the thermoelectric generator mentioned in the publication by Strasser et al. and shown in FIG. 3, this thermoelectric generator is realized by surface micromachining.

In particular, this thermoelectric generator is composed of two thermoelectric couples realized by BiCMOS technology.

Isolation between the hot part and the cold part of said thermoelectric couples is realized by means of an oxide barrier LOCOS (Local Oxidation of Silicon).

The thermoelectric material is a layer with a thickness of 400 nm in polysilicon partially doped with phosphorous for realizing n-type parts and partially doped with boron for realizing p-type parts.

The presence of bridges of aluminum prevents the formation of p-n junctions that otherwise would be present between adjacent thermoelectric parts.

In order to increase the conversion yield of thermal energy into electric energy numerous cavities in the silicon substrate have been realized.

Figure 4:
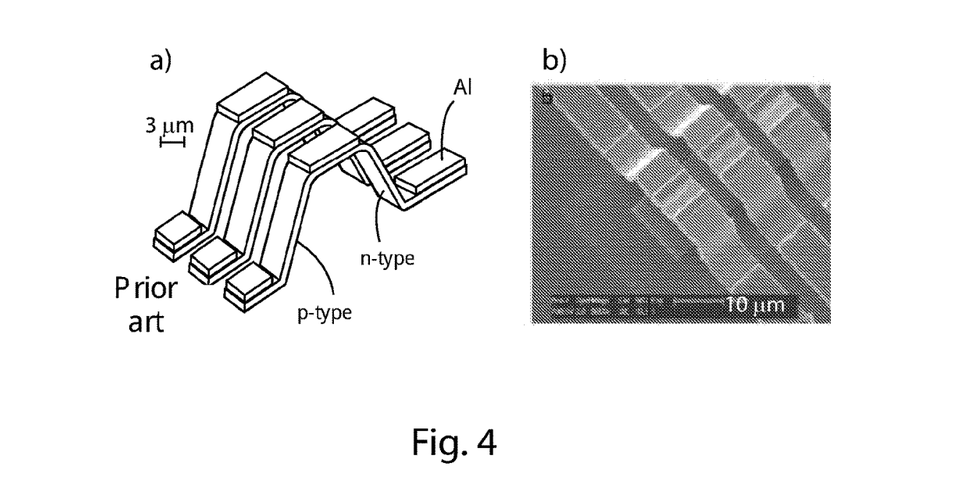
FIG. 4 shows an example of a free-standing structure according to the prior art.

Referring to the thermoelectric generator mentioned in the publication by Su et al. and shown in FIG. 4, this thermoelectric generator is composed of thermocouples realized in p-type and n-type poly-SiGe, connected among them with aluminum.

In particular, thermocouples of said thermoelectric generator are free standing. The thermoelectric material is substantially shaped as a bridge, because the underlying material has been removed for increasing the temperature difference on the terminals of the thermoelectric material.

The lower part and the upper part of said thermoelectric generator are sealed together by means of the flip-chip bonding technique and by means of an adhesive paste.

SUMMARY OF THE INVENTION

An object of the present invention is to overcome said drawbacks, providing a thermoelectric generator of compact size, having a simple structure that is configured for increasing the conversion efficiency of thermal energy into electric energy, so as it is possible to transform into electric current also as amount of heat per unit surface greater than thin film prior art devices.

It is thus an object of the present invention a thermoelectric generator according the enclosed claims, that are integral part of the present description.

BRIEF DESCRIPTION OF THE DRAWINGS

The present invention will be disclosed, merely for illustrating but not limiting purposes, according to an embodiment, referring in particular to the enclosed figures in which.

DETAILED DESCRIPTION OF THE INVENTION

Referring to FIGS. 5-8, a building block 100 of a thermoelectric generator according to the invention is illustrated.

Said part of the thermoelectric generator 100 comprises:
a first substrate or bottom substrate 110 (silicon wafer);
a second substrate or top substrate 120 (silicon wafer) facing the bottom substrate.

Figure 5:
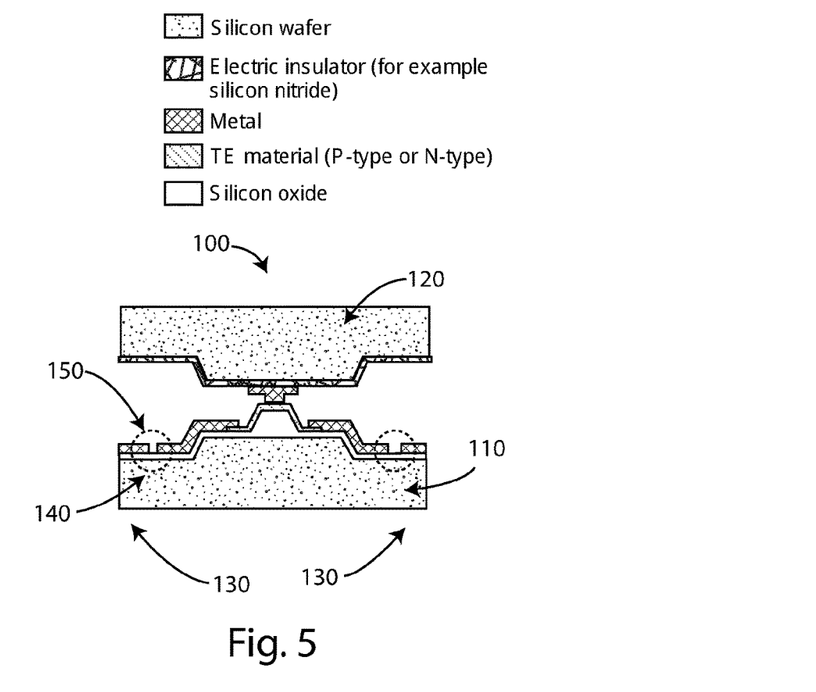
FIG. 5 shows a view of a partial section of a thermoelectric generator according to the invention.

In FIG. 5 two base elements 130 are shown, in the bottom substrate 110, with connections 140, better disclosed in detail hereinafter (see FIGS. 9, 10, 11). Between the bottom and top substrates there is an air or vacuum gap 150.

Figure 6:
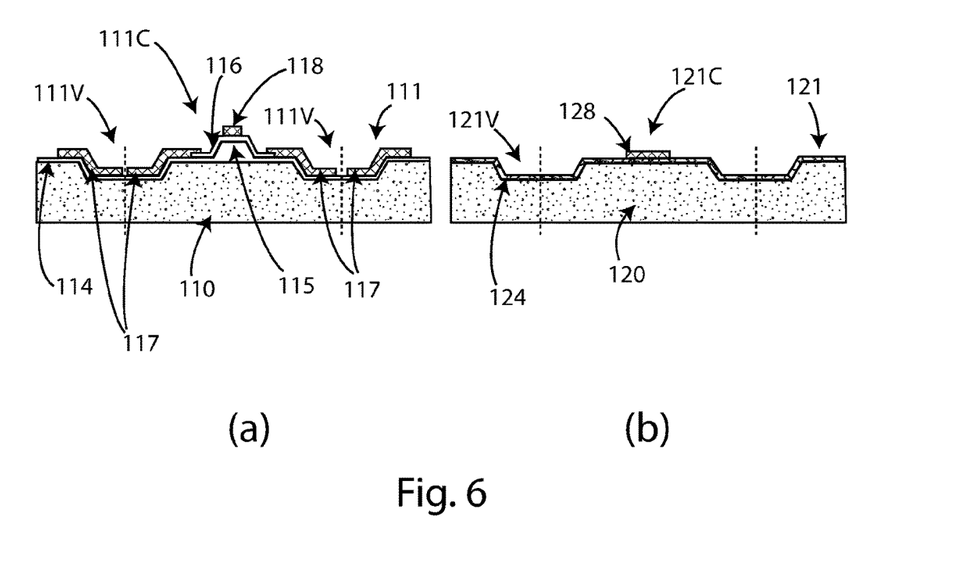
FIG. 6 shows in (a) a section of a first substrate of the thermoelectric generator of FIG. 5, in (b) a portion of a second substrate of the thermoelectric generator of FIG. 5.

Referring to FIG. 6(a), the structure of the bottom substrate 110 is illustrated. It has a surface 111 with hills 111C and valleys 111V alternated one another.

Referring to FIG. 6(b), the structure of the top substrate 120 is shown. It has a surface 121 with hills 121C and valleys 121V alternated one another.

Said first substrate 110 and said second substrate 120 are facing one another so as each hill 111C of the first substrate 110 is facing to a respective hill 121C of said second substrate 120 and so as each valley 111V of the first substrate 110 is facing a respective valley 121V of the second substrate 120, as it is clear in FIG. 5. The respective hills of both layers are in contact through their peak.

The valleys 111V of the first substrate 1 and the valleys 121V of the second substrate 2 contribute to increase the thermal resistance of air present in the gap between said substrates.

In the shown embodiment, each of said substrates is composed of a respective silicon wafer.

Referring to the bottom substrate 110, on the whole surface 111 there is a first layer 114 of electrically isolating material, for example silicon oxide or silicon nitride with a thickness that may range from few nanometers to one micron, in contact with the silicon wafer.

In contact with the first layer of electrically isolating material 114 there is a localized layer 115 of electrically isolating material (for example silicon oxide, silicon nitride) that composes the body of the hill 111C. The thickness of this localized layer 115 ranges from 1 micron up to hundreds of microns, preferably in the order of tens of microns when the thermoelectric material (illustrated hereinafter) is in the order of hundreds of nanometers. To this hill material a truncated-pyramidal shape with any base shape is imparted, for example a rectangular or square base (in the shown examples), or a truncated-conic shape by means of standard photo-lithographic techniques. The geometry of the material in this zone and its thermal characteristics are such to make a significantly greater thermal resistance than that of the other parts that constitute the base element (the hill material should be electrically isolating and from a thermal point of view it should have a thermal conductivity as low as possible in respect to that of the thermoelectric material).

Below the localized layer 115 there is a layer of thermoelectric material 116, of p-type or of n-type. This thermoelectric material is deposited onto all side faces (or onto only two faces only) of the truncated-pyramidal or truncated-conical structure 115 (see FIG. 7). The thickness may range between 10 and 1000 nm, but it could be even greater than 1 micron depending on the particular application for which the TEG is designed. Examples of TE materials are heavily doped semiconductors such as Si or SiGe.

The first substrate 110 and the second substrate 120 may be thinned or ultra-thinned crystalline silicon wafers, for carrying greater flux of heat towards the terminals of the thermoelectric material.

Finally, metals 117 extending between about one half of a valley and the beginning of a hill, above the first isolating layer 114, are deposited. There is still another metal 118 at the top of the hill 111C above the thermoelectric material 116. All these metals are electric contacts. The base of the metal 118 that rests on the peak of the hill of the truncated-pyramidal or truncated-conical structure is also a thermal contact.

Figure 7:
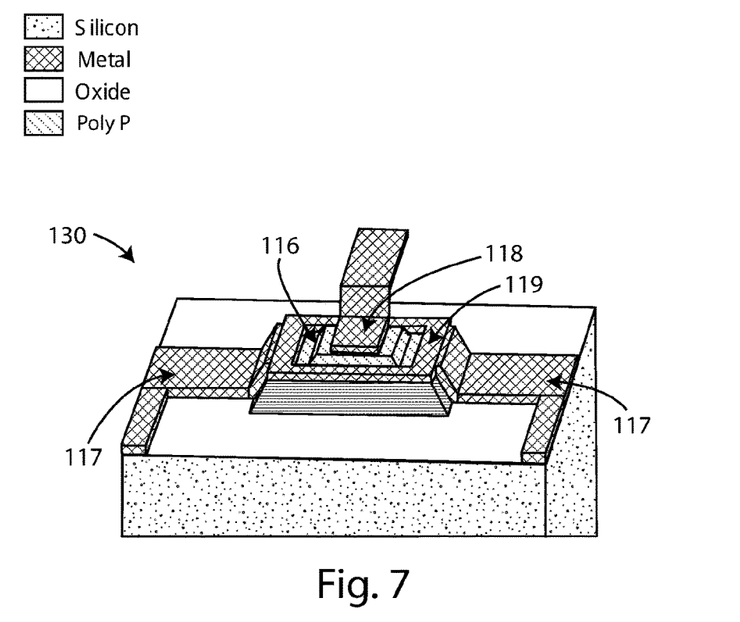
FIG. 7 shows a perspective view of a portion of the thermoelectric generator of figure 5, with a layer of an electrically and thermally isolating material placed on a portion of a first hill of the first substrate, which is shaped as a truncated pyramid, solid or even partially hollow, and coated by a thermoelectric material, the latter being in contact with metal conductors.

The base element 130 of the bottom layer 110 is shown in FIG. 7 in a perspective view. A metal 119, that may be considered an extension of the metal 117 and that surrounds the peak of the hill, is shown.

The electric contacts 118 and 119 between said metal contacts superposed to the thin film of thermoelectric material may be fixed through a multilayer interface comprising a film of silicide belonging to the group composed of TiSi2, WSi2, MoSi2, PtSi2 and CoSi2, for reducing the electric contact resistance. In the same way, the same metal contacts may be fixed through a multilayer interface comprising an intermediate film of a refractory metal belonging to the group composed of W, Ti, Ta and a film of Titanium nitride in contact with the metal.

Referring to the top substrate 120, on the whole surface 121 there is a first layer 124 of an electrically isolating material, for example silicon oxide or silicon nitride with a thickness that may range between few nanometers and one micron, in contact with the silicon wafer.

An electric contact 128 is deposited onto the isolating layer 124, at the peak of the hill 121C.

Figure 8:
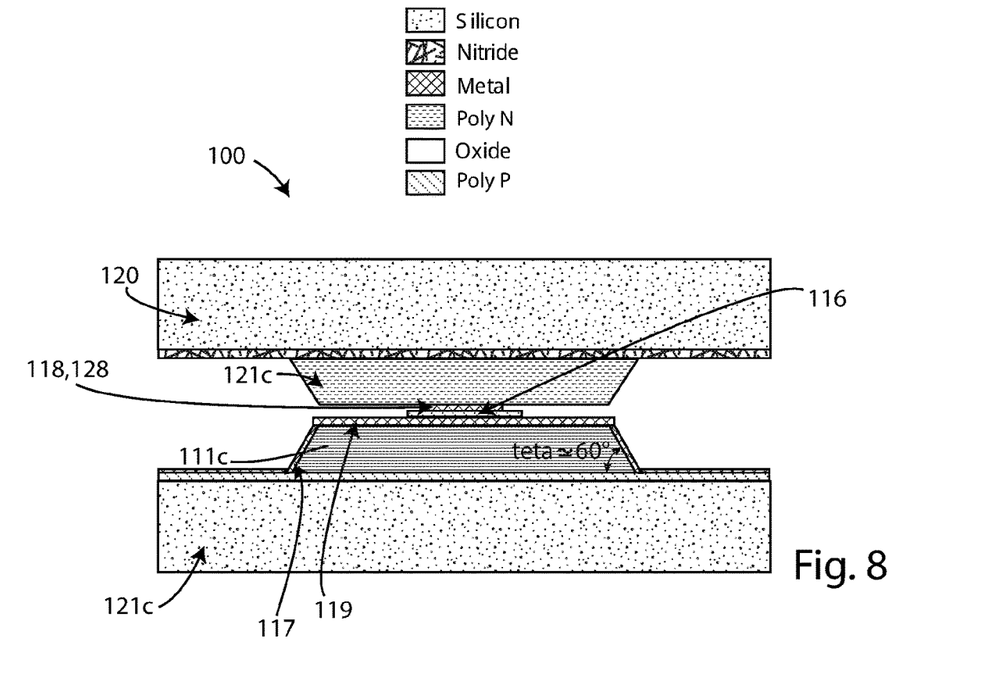
FIG. 8 shows a sectional side view of a base element of an embodiment of the thermoelectric generator according to the invention.

The contacts placed at the peak of the hills of the upper layer and of the lower layer are in contact in the device according to the invention. FIG. 8 shows this contact at magnified view.

The silicon wafers mentioned above may be micromachined, joined together by means of a smart-cut processing or of the technique Smart Stacking™ by Soitec for transferring layers.

As far as the embodiment of the bottom substrate is concerned (bottom chip, FIG. 6(a)), it is possible to use known technique and future techniques. In particular is it possible to proceed for example as following:

1) Starting from a monocrystalline silicon substrate, a film of thermal oxide (of a thickness of 1 μm or 2 μm) is deposited. This oxide will serve as a mask for the following etchings.

2) By means of a photolithographic process, openings in the thermal oxide are made for realizing valleys engravings (111V).

3) By means of a combination of chemical etchings (Wet) and plasma etchings (Reactive Ion Etch) the valleys (111V) are realized on the silicon substrate of the Bottom Chip.

4) A film of thick silicon oxide is deposited (thickness from 1 μm to 10 μm) through a LPCVD (Low Pressure Chemical Vapour Deposition) technique, a PECVD (Plasma Enhanced Chemical Vapour Deposition) technique or through deposition of SOG (Spin On Glass).

5) The hill structures (115) are realized, with a controlled slope [reference OPTICS EXPRESS, Vol. 20, No. 20/22934 (2012)], through photolithographic masks and a combination of chemical etchings (Wet) and plasma etchings (Reactive Ion Etch) of the thick silicon oxide.

6) A thermal oxide is grown (thickness of several hundreds of nanometers) on the silicon that has been exposed during the previous attacks. This oxide will be used for isolating electrically the substrate.

7) The thermoelectric material is deposited ("p" type or "n" type) and, for the photolithography, the active zones of thermoelectric material are delimited on the hills of thick oxide.

8) A metal film is deposited by sputtering technique and, by photolithography, the interconnection zones of the Bottom Chip are delimited.

As far as the realization of the top substrate (FIG. 6(b)) is concerned, it is possible to use known techniques and future techniques. In particular, it is possible to proceed for example as follows:

1) Starting from a inonocrystalline silicon substrate a thermal oxide is grown (of a thickness of 1 μm or 2 μm). This oxide will serve as a mask for the following etchings.

2) By means of a photolithographic process, openings in the thermal oxide are made.

3) By means of a combination of chemical etchings (Wet) and plasma etchings (Reactive Ion Etch) the valleys (121V) are realized on the silicon substrate of the Top Chip.

4) By Wet etching, the film of thermal oxide is removed.

5) A film of silicon nitride is deposited through a LPCVD (Low Pressure Chemical Vapour Deposition) technique or a PECVD (Plasma Enhanced Chemical Vapour Deposition) technique. This film of nitride will serve to isolate electrically the interconnections to be realized on the wafer of the Top Chip, as illustrated in the next step.

6) A metal film is deposited through a sputtering technique and by photolithography, the interconnection zones of the Top Chip are delimited.

This technique refers to the following publications:
"Semiconductor Devices, Physics and Technology, 2nd edition", S. M. Sze. John Wiley and Sons (2002)
Handbook of Semiconductor Manufacturing Technology, Second Edition, Yoshio Nishi, Robert Doering. CRC Press (2007)
"A fully integrated high-Q Whispering-Gallery Wedge Resonator" Fernando Ramiro-Manzano, Nikola Prtljaga, Lorenzo Pavesi, Georg Pucker and Mher Ghulinyan, OPTICS EXPRESS, Vol. 20, No. 20/22934 (2012).

Several features that make the herein proposed device different from those according the prior art are:
lack of suspended or bridge structures;
3D structure of the thermoelectric material with a consequent increase of the capability of transforming heat into electricity;

greater thermal insulation between the bottom layer and the top layer. Consequently, enhanced capability of thermal coupling with the outside and thus greater capability of thermoelectric conversion;

better thermal contact among the elements of the bottom substrate and of the top substrate that carry heat (the improvement in respect to the prior art is due to the use of flip-chip bonding or metal-to-metal bonding); p1 enhanced management of both thermal and electrical fluxes: the use of a hill material that has a great thermal resistance and the presence of air/vacuum in the cavities, allow to convey better heat inside the TE material. For example in the prior art solution of FIG. 3, the presence of the silicon oxide creates a thermal short circuit between the hot and cold parts; by contrast, in the solution of FIG. 4 the hot and cold parts are closed than in the herein disclosed solution in which there are engravings in the wafers, as shown at points 111V and 121V;

use of thinned substrates with a consequent reduction of substrate losses. The wafer may be thinned down to the limit of having a structure still mechanically stable (a range could be from 10 to 1000 microns).

In order to obtain a thermoelectric generator having the maximum temperature difference at the terminals of the thermoelectric material ($\Delta T_{effettivo}$) an air gap or a gap under vacuum is exploited, in order to allow a better thermal decoupling between the bottom substrate and the top substrate, instead of the oxide layer LOCOS disclosed in the document by Strasser et al.

By contrast, in respect to the device disclosed in the document by Su, Leonov et al., a greater $\Delta T_{effettivo}$ is obtained because the integration of the bottom substrate and of the top substrate is carried out by means of flip-chip bonding or metal-to-metal bonding, without using adhesives that introduce unavoidably losses of heat flux that determines the $\Delta T_{effettivo}$. Moreover, the use of thinned substrates allow to reduce the relevant thermal losses. The presence of a bonding through metal or through oxide, instead of bondings that contemplate the use of polymeric materials or thermal pastes, allows also to attain higher temperatures before degradation.

Figure 9:
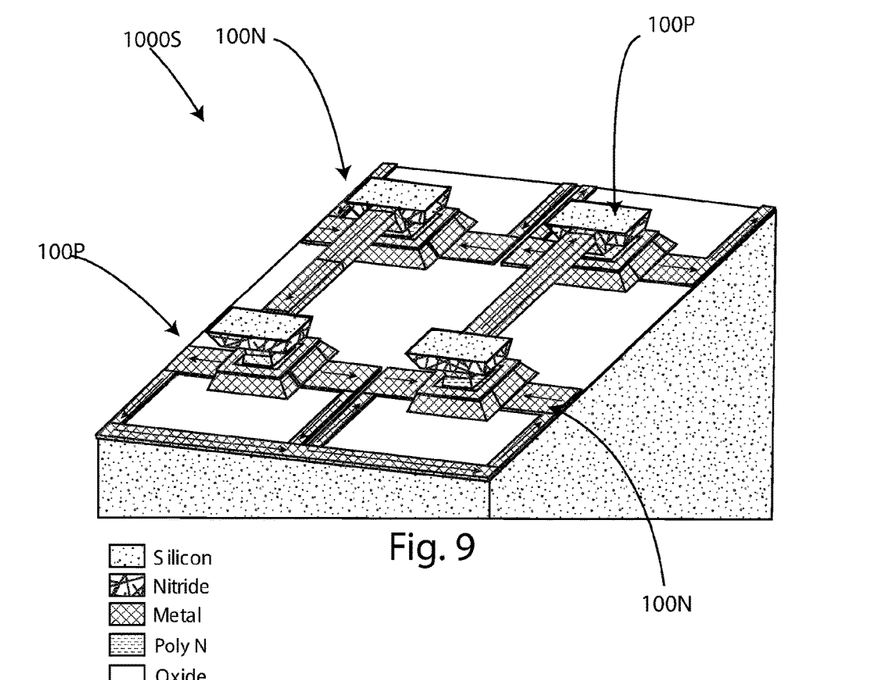
FIG. 9 shows a perspective view of elements according to FIG. 7 connected in series, according to an aspect of the invention.
Figure 10:
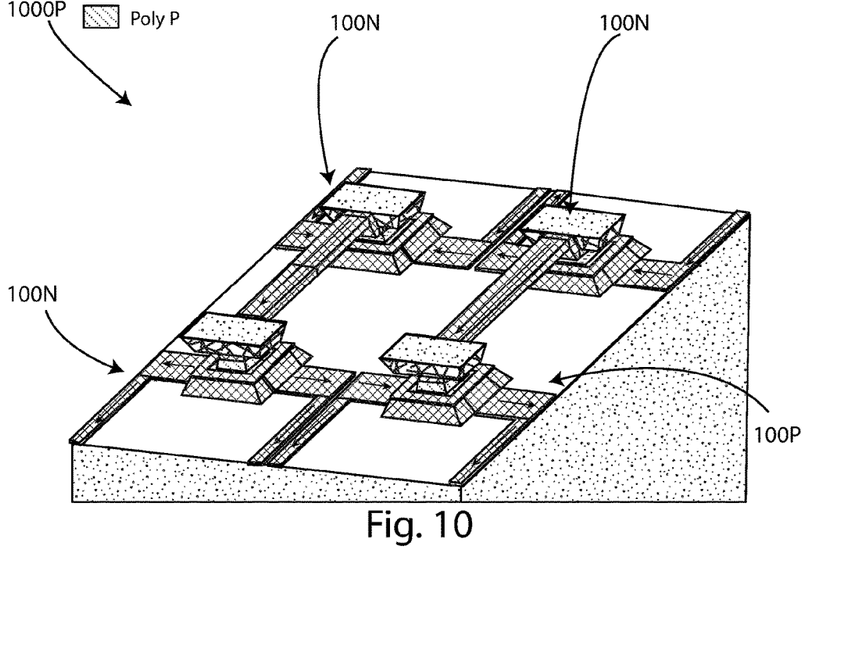
FIG. 10 shows a perspective view of elements according to FIG. 7 connected in parallel, according to an aspect of the invention.
Figure 11:
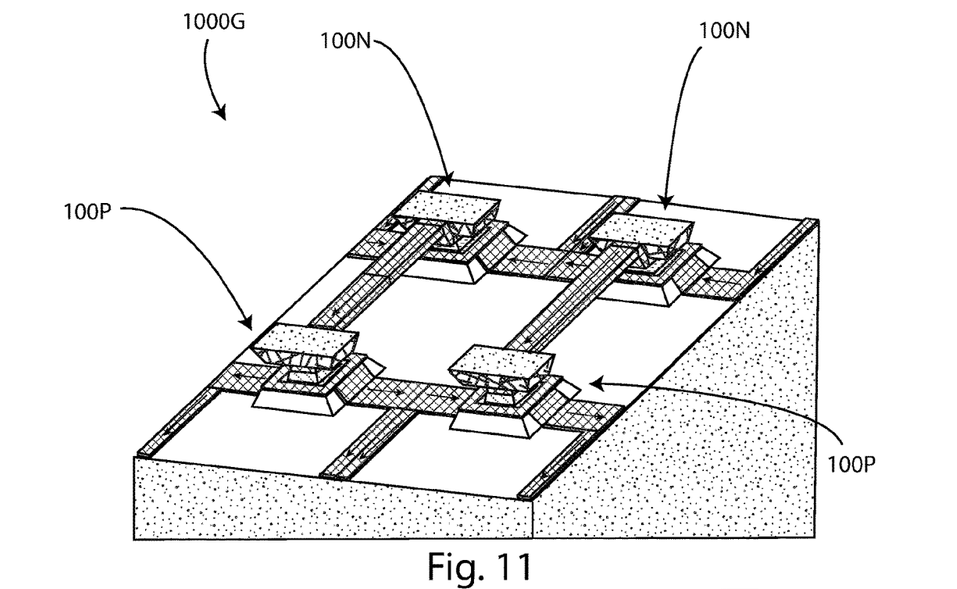
FIG. 11 shows a perspective view of elements according to FIG. 7 connected as a grid, according to an aspect of the invention.

In order to obtain a TEG starting from a base element, it is necessary to connect in the most appropriate manner more p-type and n-type base elements. The base elements are of n-type when a thermoelectric material constituted by a heavily doped (for example with boron) semiconductor (for example silicon) in which the majority carriers are composed of electrons and of p-type when a thermoelectric material (for example silicon) composed of a heavily doped semiconductor (for example with phosphorous) in which the majority carriers are holes. Hereinafter the electrical connection between the two base elements of p-type (100P) and two of n-type (100N) are illustrated:

a) Series connection 1000S of two pairs of base elements of p-type and n-type, see FIG. 9.

b) Parallel connection 1000P of two pairs of base elements p and n, see FIG. 10.

c) Grid connection 1000G of two pairs of base elements p and n, see FIG. 11.

In FIGS. 9-11 the different electric connections among base elements are shown, the arrows indicate the sense in which the electric current would flow in the hypothesis in which the top substrate of the thermoelectric generator were in contact with a thermal bath at a temperature Thot and the bottom substrate of the thermoelectric generator were in contact with one at a temperature Tcold.

Figure 12:
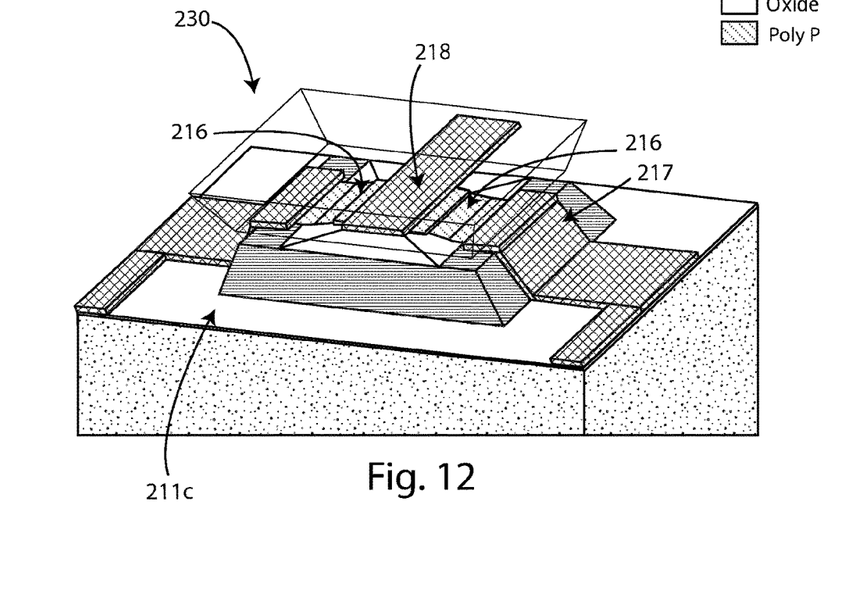
FIG. 12 shows a perspective view of a different base element of an embodiment of the thermoelectric generator according to the invention.

Another possible embodiment of the proposed invention contemplates a base block of the bottom layer 230 with a truncated-pyramidal hill 211C, the deposition of the thermoelectric material 216 on two side faces only of the truncated pyramid, and the side 217 and upper 218 electric contacts as shown in FIG. 12.

Figure 13:
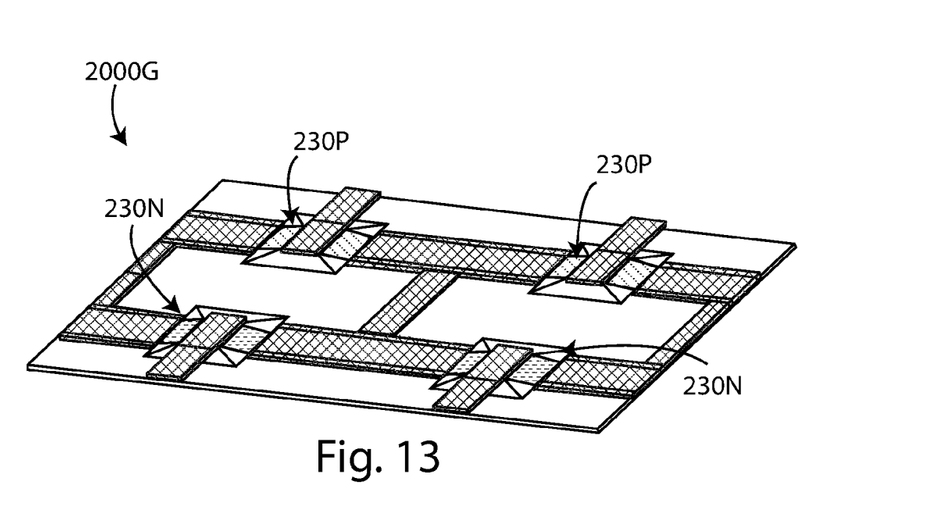
FIG. 13 shows a perspective view of elements according to FIG. 12 connected as a grid, according to an aspect of the invention.

In order to obtain a thermoelectric generator starting from the base element shown in FIG. 5, it is necessary to connect a plurality of base elements of p-type and of n-type as shown hereinbefore. Merely for example, FIG. 13 depicts the grid type connection 2000G among base elements 230P of p-type and 230N of n-type.

The building blocks are joined by alternating, in the current flux, p-type elements and n-type elements. The union by alignment of the building blocks is carried out according to a chip-on-chip mode, chip-on-wafer, wafer-on-wafer; or according to a chip-on-wafer on-substrate or chip-on-chip-on-substrate mode.

Figure 14:
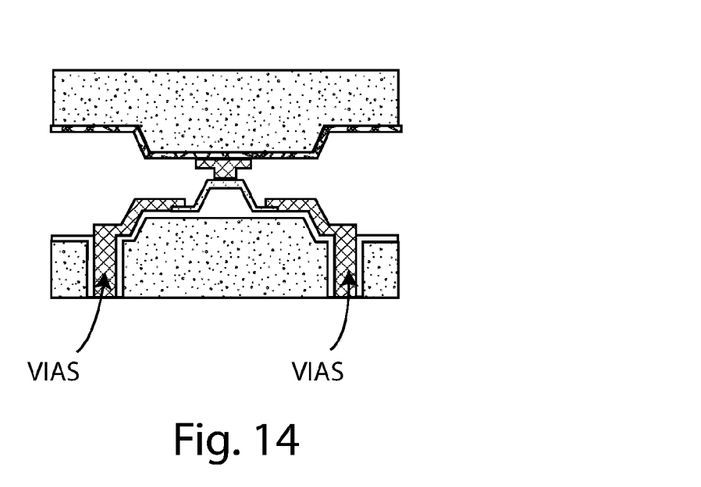
FIG. 14 shows a further embodiment of the invention, wherein the electrical connections among the building blocks are realized on the back part of the base silicon wafer by means of interconnection VIAS.

Referring to FIG. 14, another advantageous embodiment of the invention is highlighted, in which the electrical connections among said building blocks are realized on the back side of the base silicon wafer 110 by means of the use of interconnection VIAS. The presence of VIAS constitutes a synergy with the rest of the above disclosed geometry. Indeed, there is a better heat sinking, because heat must follow a path; it shall not go in the substrate but it shall cross it and be sunk beyond the silicon substrate.

Moreover in these VIAS electric energy flows therethrough at the same time. The VIAS are preferably realized in a thinned wafer.

Advantages of the invention

Advantageously, the thermal generator, object of the invention, allows to maximize the temperature difference on the terminals of the generator. A second advantage is given by the fact that there are not inside the thermoelectric generator, object of the invention, suspended structures or bridge structures, differently from prior art thermoelectric generators (such as for example those disclosed in the publication by Strasser et al. and in the publication by Su, Leonov et al.). From a mechanical point of view, said suspended structures or bridge structures weaken the structure of the thermoelectric generator and/or make said thermoelectric generator unsuitable to resist to high temperatures (greater than 60° C.) and/or to be sealed by means of specific types of bonding, such as for example flip-chip bonding or metal-to-metal bonding.

As a consequence, the absence of suspended structure or bridge structures makes the thermal generator, object of the invention, more robust from a mechanical point of view. Moreover, the structure can be miniaturized and directly integrated in the traditional electronic devices, or directly onto silicon or in heterogeneous integrations.

It is possible to organize the base elements in more complex architectures in order to respond to specific application requirements, by placing the base elements electrically in series and/or in parallel in function of the electric amounts that it is desired to obtain at the output. It is possible for example to modify within a certain range the output electrical amounts of the generators by working on the series-parallel electrical interconnections among base elements: for example, if n base elements are all placed electrically in series, the greatest deliverable voltage and the greatest electric resistance (series of n unitary resistances) will be obtained; if the n base elements are placed in parallel, a generator with the minimum resistance (parallel of n unitary resistances) will be obtained; series-parallel connections allow to obtain an electric response that may be modulated between the two ends, either fully in series or fully in parallel.

The present invention has been disclosed merely for illustrative non limiting purposes, according to a preferred embodiment, but it is understood that variations and/or modifications may be carried out by a skilled person, without for this reason departing from the scope of protection, as defined in the enclosed claims.

The invention claimed is:

1. A building block of an integrated thermoelectric generator with out-of-plane heat flow configuration, comprising a base silicon wafer and a cover silicon wafer each having two opposite faces, wherein:
   said base silicon wafer has, on one face of said opposite faces, a plurality of hills and a plurality of valleys between said hills;
   each of said hills comprises a first truncated pyramid or cone in the silicon wafer, on which a second truncated pyramid or cone is connected, which is made of electrically and thermally insulating material, wherein the larger base of the second truncated pyramid or cone is smaller than and in contact with the smaller base of the first truncated pyramid or cone in the silicon wafer;
   on the smaller base and at least partially on a side surface of said second truncated pyramid or cone is present a layer of p-doped or n-doped type thermoelectric material which extends also over a portion of the smaller base of said first truncated pyramid or cone,
   a top electrical contact is present on the smaller base of said second truncated pyramid or cone and two or more side contacts which at one end are in contact with said layer of thermoelectric material on said portion of the smaller base of said first truncated pyramid or cone and extend on the side of a respective hill up to a portion of a respective valley;
   said cover silicon wafer has on one face of said opposite faces a plurality of valleys and hills,
   on substantially the whole of said one face of the cover silicon wafer there is a layer of electrically insulating material;
   on top of the plurality of hills of said cover silicon wafer top contacts are placed which serve both as electrical contacts and as top thermal contacts; and
   said cover silicon wafer is facing said base silicon wafer in such a way that the respective top contacts are in contact and the space between said cover silicon wafer and said base silicon wafer is a space in which vacuum is made or a gas is present.

2. The building block of an integrated thermoelectric generator according to claim 1, wherein said top and side contacts are made of metal.

3. The building block of an integrated thermoelectric generator according to claim 1, wherein on said one face of the base silicon wafer there is a layer of electrically insulating material, with a thickness of between 1 nm to 1 µm.

4. The building block of an integrated thermoelectric generator according to claim 1, wherein said thermoelectric material is a n- or p-type doped semiconductor.

5. The building block of an integrated thermoelectric generator according to claim 1, wherein said second truncated pyramid or cone has a height of between 1 micron and 500 microns.

6. The building block of an integrated thermoelectric generator according to claim 1, wherein said second truncated pyramid or cone is of a material selected from the group consisting of: silicon dioxide, oxides with high resistance to heat conduction, lattice structures of nanometric material phonon, and super-latexes of silicon nanometric thin film.

7. An integrated thermoelectric generator formed by two or more blocks according to claim 1, wherein said two or more blocks are connected to each other by means of said side contacts and said top contacts in such a way that they are connected in series, or in parallel or in a grid, and so that an electric current generated by Seebeck effect flows through alternating blocks with thermoelectric material of n- and p-doped type.

8. The integrated thermoelectric generator according to claim 7, wherein between the respective top contacts of the base wafer and the cover a flip-chip bonding is present.

9. The integrated thermoelectric generator according to claim 7, wherein said base wafer and cover wafer are joined in alignment with a technique selected from the group consisting of: metal-to-metal bonding, metal-to-metal thermo-compression, plasma union, union through benzociclobutene, union through polyamides, union through intermetallic compounds, union through solid-liquid interdiffusion (SLID), union by eutectic alloy, copper-oxide union, metal-metal oxide union, anodic union and union through micro-bump.

10. The integrated thermoelectric generator according to claim 7, wherein the electrical connections between said constituent blocks are made on the other face of said opposite faces of the base silicon wafer by vias for interconnection.

11. The building block of an integrated thermoelectric generator according to claim 2, wherein said top side contacts are made of a metal selected from the group consisting of aluminum, copper, silver and metal alloys.

12. The building block of an integrated thermoelectric generator according to claim 1, wherein the gas is air.

* * * * *